United States Patent [19]

Fitch

[11] Patent Number: 5,103,114
[45] Date of Patent: Apr. 7, 1992

[54] CIRCUIT TECHNIQUE FOR CREATING PREDETERMINED DUTY CYCLE

[75] Inventor: Jonathan M. Fitch, Cupertino, Calif.

[73] Assignee: Apple Computer, Inc., Cupertino, Calif.

[21] Appl. No.: 495,465

[22] Filed: Mar. 19, 1990

[51] Int. Cl.$^5$ .................. H03L 7/00; H03K 19/21
[52] U.S. Cl. .................. 307/271; 307/471; 307/479; 307/234; 307/265; 328/20
[58] Field of Search .............. 328/20, 15, 34, 38; 307/271, 234, 471, 479, 265

[56] References Cited

U.S. PATENT DOCUMENTS

| | | | |
|---|---|---|---|
| 3,479,603 | 11/1969 | Overstreet, Jr. | 307/479 |
| 3,786,357 | 1/1974 | Belle Isle | 328/20 |
| 4,077,010 | 2/1978 | Ryon | 328/20 |
| 4,669,099 | 5/1987 | Zinn | 328/20 |

OTHER PUBLICATIONS

McGahee, "Pulse-Frequency Doubler Requires No Adjustment", *Electronics*, Apr. 17, 1975, p. 149.

Primary Examiner—Timothy P. Callahan
Attorney, Agent, or Firm—Blakely, Sokoloff, Taylor & Zafman

[57] ABSTRACT

A circuit for allowing a clock of any specified duty cycle to be created from a clock of the same frequency using standard digital delay lines. In particular, an EXOR function is implemented to generate a clock signal having a frequency which is twice the frequency of its input signals by using standard logic components such that the active branch for each input edge has an independent path to the output signal. In this manner, if a time delay is introduced into the active branch and only the active branch, the corresponding output edge and only that edge will be delayed by a like amount. Over a complete cycle of the input waveforms, four output edges are produced (two clock cycles). By varying the delay on the input branches, these output edges can be placed independently and arbitrarily within the period. As such, an output waveform having any desired duty cycle can be created independent of the phase relationship between the two input waveforms.

9 Claims, 2 Drawing Sheets

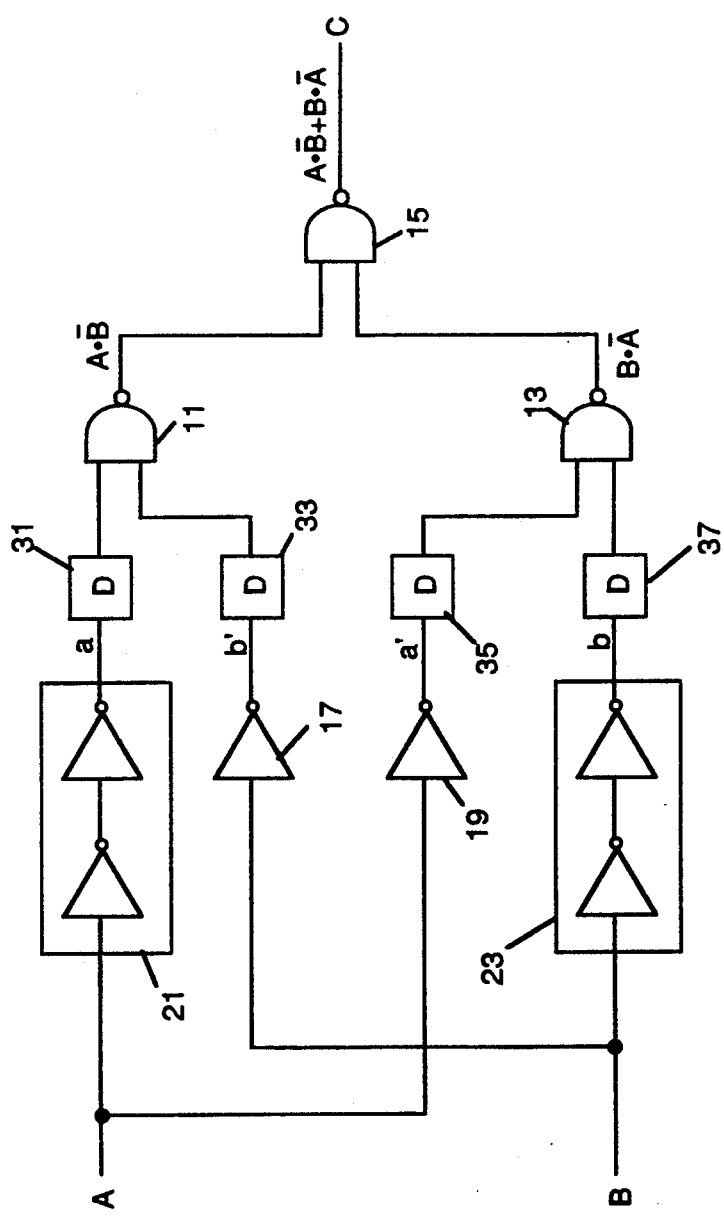

CIRCUIT TECHNIQUE FOR CREATING PREDETERMINED DUTY CYCLE

SUMMARY OF THE INVENTION

A circuit technique is disclosed allowing a clock of any specified duty cycle to be created from a clock of the same frequency using standard digital delay lines. In particular, an EXOR function is implemented to generate a clock signal having a frequency which is twice the frequency of its input signals by using standard logic components such that the active branch for each input edge has an independent path to the output signal. In this manner, if a time delay is introduced into the active branch and only the active branch, the corresponding output edge and only that edge will be delayed by a like amount. Over a complete cycle of the input waveforms, four output edges are produced (two clock cycles). By varying the delay on the input branches, these output edges can be placed independently and arbitrarily within the period. As such, an output waveform having any desired duty cycle can be created independent of the phase relationship between the two input waveforms.

BRIEF DESCRIPTION OF THE DRAWINGS

FIG. 2 is a table showing the truth table for an EXOR function.

FIG. 3 is a schematic diagram of an implementation of an EXOR function for creating a 2 times clock signal according to the present invention.

DETAILED DESCRIPTION OF THE INVENTION

Figure 4:
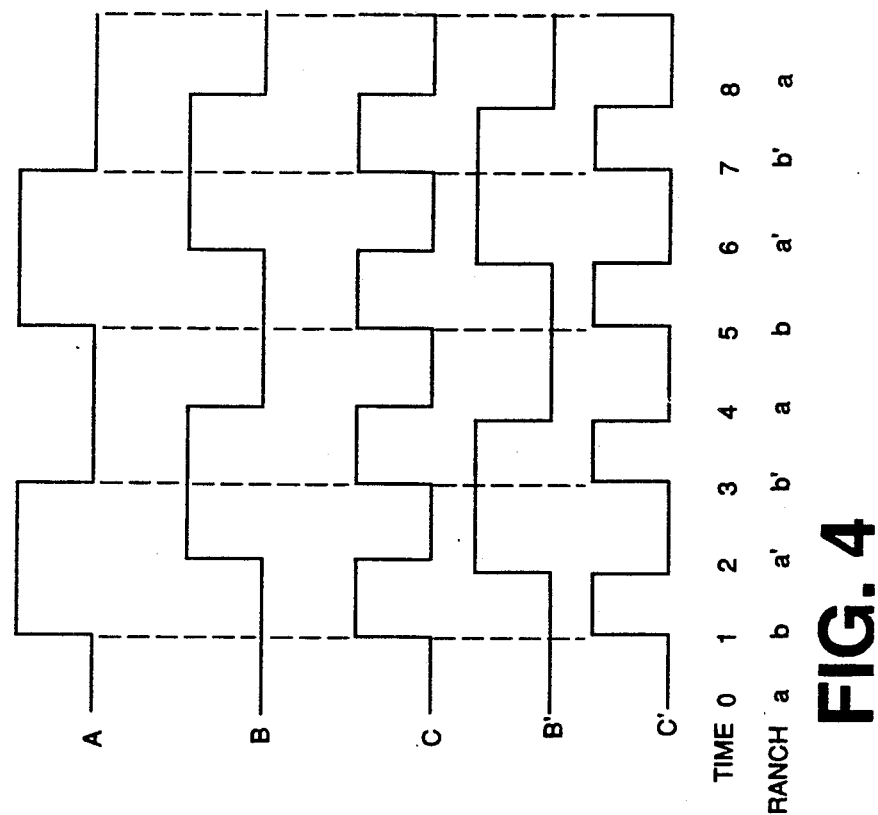
FIG. 4 is a timing diagram showing of the timings of input and output signals for the circuits of FIGS. 1 and 3.

A circuit is disclosed for implementing an EXOR function which may be used to generate a clock signal having a frequency which is twice the frequency of its input signals. An examination of the truth table of an EXOR function when used with inputs clocked in quadrature relationship reveals that each edge of the output waveform is produced by exactly one edge of the input waveforms. For example, referring to FIGS. 1, 2 and 4, at an arbitrary time 0, and assuming that all the logic elements in FIG. 1 have zero delay, signals A and B, if clocked precisely in a quadrature relationship, when input to the circuit of FIG. 1 will produce an output C which is 0 since A and B are 0. However, at time 1, since the A signal has gone to 1, while the B signal has remained at 0, the output C' goes to 1. Then at time 2, when signal B has also gone to 1, output C' goes back to 0 until time 3 when signal A goes back to 0 causing the output C' to go back to 1. This cycle is repeated so long the input signals A and B remain in a precise quadrature relationship. However, should signals A and B not be in a precise quadrature relationship, such as the signals A and B' of FIG. 4, then the output signal will look like C' having a duty cycle other than 50%.

Figure 1:
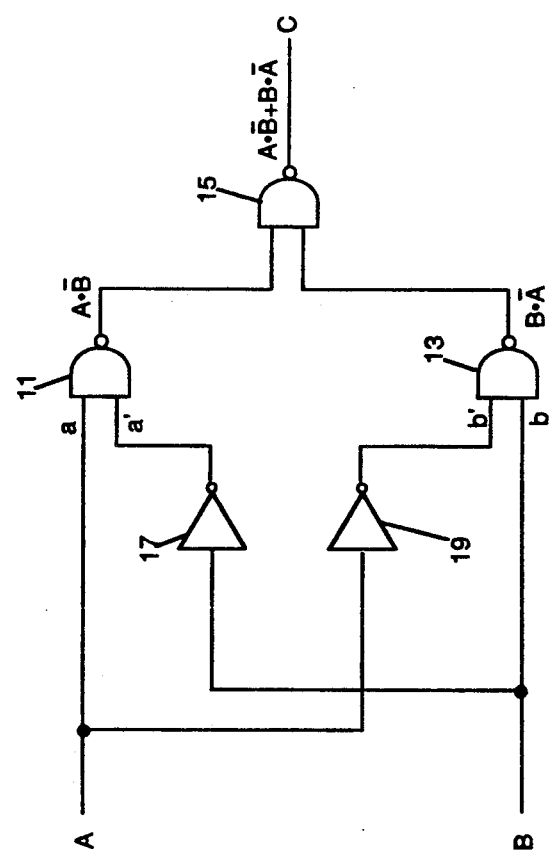
FIG. 1 is a schematic diagram of a typical NAND gate implementation of an EXOR function for creating a 2 times clock signal.

Thus, if the inputs to the EXOR function implemented by the circuit of FIG. 1 could be guaranteed to be in a precise quadrature relationship, and the delays introduced by the elements were zero (e.g., if the delays cancelled each other out), it would always be possible to implement an EXOR function using the circuit of FIG. 1 and be certain that the output signal will always have a 50% duty cycle.

However, since it cannot always be guaranteed that the inputs to the EXOR function will have a precise quadrature relationship, or that the delays introduced by the elements in the circuit will cancel each other out, by using the present invention, an EXOR function can be constructed using standard logic such that the active branch for each input edge has an independent path to the output signal. In this connection, it should be noted that an EXOR gate implemented according to the circuit of FIG. 1 has four active branches namely a, a', b and b', since according to the truth table of FIG. 2 and the waveforms of FIG. 4, the input edges of the waveforms are always offset by at least some period of time, and the output waveform is determined by the value of only one of the input waveform edges at any given point in time. For this reason, when an EXOR function is implemented having four branches a, a', b and b', if a time delay is introduced into the active branch and only the active branch, the corresponding output edge and only that edge will be delayed by a like amount. Over a complete cycle of the input waveforms, four output edges are produced (two clock cycles). By varying the delay on the input branches, these output edges can be placed independently and arbitrarily within the period. This allows duty cycle correction in circuits where the quadrature waveforms are generated by different cells (for example, one positive edge and one negative edge triggered JK flip-flop) which may have different time delays resulting in an output waveform such as C' shown in FIG. 4 as compared with output waveform C also shown in FIG. 4 having a duty cycle of 50%. An example of a circuit using JK flip-flops for generating input signals of the same frequency in a quadrature or nearly quadrature relationship may be found in copending application Ser. No. 495,329 filed Mar. 19, 1990.

An EXOR gate implemented as shown in FIG. 1 using three NAND gates 11, 13 and 15 and two inverters 17 and 19 to produce the EXOR truth table as shown in FIG. 2 will generate an output waveform C as shown in FIG. 4 assuming that delays introduced by the logic elements cancel each other out and its A and B inputs are 90° out of phase as shown in FIG. 4. However, as previously noted, when quadrature waveforms are generated by different cells which may have different delays, such as the A and B' waveforms of FIG. 4 which may not be exactly 90° out of phase, and/or the delays introduced by the components of the EXOR gate itself do not cancel each other out, the resulting output waveform would appear such as that of the waveform C' shown in FIG. 4.

The present invention allows a correction to be applied so that the duty cycle of the output waveform C is 50% even if the input waveforms A and s are not 90° out of phase and/or the component delays are not cancelled out. In particular, FIG. 3 is an implementation of an EXOR gate, such that the active branch for each input edge has an independent path to the output signal. The correction is applied to each of the four possible branches a, a', b and b' of the EXOR function implemented as shown in FIG. 3 by isolating each branch and applying a predetermined delay to each branch in order to obtain an output waveform having the desired duty cycle. In particular, the a/a' branches and b/b' branches are isolated by adding buffers 21 and 23 which may be implemented simply as a pair of inverters as shown in FIG. 3. After each branch has been so isolated, each branch has a delay element D coupled between buffers 21 and 23 and inverters 17 and 19 on the one hand, and the inputs to NAND gates 11 and 13 on the other, as shown in FIG. 3 by the elements 31, 33, 35 and 37 respectively. Each of the delay elements D has a predetermined amount of delay built in to provide the necessary correction so as to produce an output waveform having a 50% duty cycle.

To determine the amount of delay to introduce by each delay element D, a circuit simulation is performed based upon the known characteristics of the elements, for example JK flip flops, used to generate the A and B input waveforms and the gates used to construct the EXOR function. The amount of delay to be built into each delay element would itself be a function of the duty cycle of the output waveform which of course need not be 50%. A suitable circuit simulation for this purpose may be performed using simulation programs such as SPICE or ASPECT. The details for determining the proper amount of delay and building delay elements D incorporating the determined amount of delay should be readily apparent to a person having ordinary skill in the relevant art.

I claim:

1. A circuit for receiving first and second input waveforms having substantially the same frequency for generating an output waveform having a frequency which is substantially twice the frequency of said first and second input waveforms and having a duty cycle which is substantially independent of the phase relationship between said first and second input waveforms, said circuit comprising:
   a) first gate means for receiving said first input waveform from a first input line containing said first input waveform and an inversion of said second input waveform from a first inverter coupled to a second input line containing said second input waveform;
   b) second gate means for receiving said second input waveform from a third input line containing said second waveform and an inversion of said first input waveform from a second inverter coupled to a fourth input line containing said first input waveform, wherein said first and said fourth input lines are isolated by a first buffer means coupled between said first gate means and said second inverter, and said second and third input lines are isolated by a second buffer means coupled between said second gate means and said first inverter;
   c) first delay means coupled between said first gate means and said first buffer means for applying a first predetermined delay to said first input waveform;
   d) second delay means coupled between said first gate means and said first inverter for applying a second predetermined delay to said inversion of said second input waveform;
   e) third delay means coupled between said second gate means and said second inverter for applying a third predetermined delay to said inversion of said first input waveform;
   f) fourth delay means coupled between said second gate means and said second buffer means for applying a fourth predetermined delay to said second input waveform; and
   g) third gate means coupled to said first and second gate means for receiving outputs from said first and second gate means and producing said output waveform whereby said output waveform has a frequency which is substantially twice the frequency of said first and second input waveforms and has a duty cycle which is substantially independent of the phase relationship between said first and second input waveforms as determined by said first, second, third and fourth predetermined delays.

2. The circuit defined by claim 1 wherein said first buffer means comprises third and fourth inverters coupled in series.

3. The circuit defined by claim 1 wherein said second buffer means comprises third and fourth inverters coupled in series.

4. A circuit for receiving first and second input waveforms having substantially the same frequency for generating an output waveform having a frequency which is substantially twice the frequency of said first and second input waveforms and having a duty cycle which is substantially independent of the phase relationship between said first and second input waveforms, said circuit comprising:
   a) a first NAND gate for receiving said first input waveform from a first input line containing said first input waveform and an inversion of said second input waveform from a first inverter coupled to a second input line containing said second input waveform;
   b) a second NAND gate for receiving said second input waveform from a third input line containing said second waveform and an inversion of said first input waveform from a second inverter coupled to a fourth input line containing said first input waveform, wherein said first and said fourth input lines are isolated by a first buffer means coupled between said first NAND gate, and said second inverter, and said second and third input lines are isolated by a second buffer means coupled between said second NAND gate and said first inverter;
   c) first delay means coupled between said first NAND gate as a first input thereto and said first buffer means for applying a first predetermined delay to said first input waveform;
   d) second delay means coupled between said first NAND gate as a second input thereto and said first inverter for applying a second predetermined delay to said inversion of said second input waveform;
   e) third delay means coupled between said second NAND gate as a first input thereto and said second inverter for applying a third predetermined delay to said inversion of said first input waveform;
   f) fourth delay means coupled between said second NAND gate as a second input thereto and said second buffer means for applying a fourth predetermined delay to said second input waveform; and
   g) third NAND gate coupled to said first and second NAND gates means for receiving outputs from said first and second NAND gate means and producing said output waveform.

whereby said output waveform has a frequency which is substantially twice the frequency of said first and second input waveforms and has a duty cycle which is substantially independent of the phase relationship between said first and second input waveforms, said duty cycle being determined by said first, second, third and fourth predetermined delays.

5. The circuit defined by claim 4 wherein said first buffer means comprises third and fourth inverters coupled in series.

6. The circuit defined by claim 4 wherein said second buffer means comprises third and fourth inverters coupled in series.

7. The circuit defined by claim 4 further comprising a third NAND gate having one input coupled to said first NAND gate and having a second input coupled to said second NAND gate.

8. The circuit defined by claim 1 wherein respective delays introduced by each of said first, second, third and fourth delay means are determined by circuit simulation software.

9. The circuit defined by claim 4 wherein respective delays introduced by each of said first, second, third and fourth delay means are determined by circuit simulation software.

* * * * *